(12) United States Patent
Sarin et al.

(10) Patent No.: US 8,127,091 B2
(45) Date of Patent: Feb. 28, 2012

(54) PROGRAMMING MEMORY CELLS WITH ADDITIONAL DATA FOR INCREASED THRESHOLD VOLTAGE RESOLUTION

(75) Inventors: Vishal Sarin, Cupertino, CA (US); Frankie F. Roohparvar, Monte Sereno, CA (US)

(73) Assignee: Micron Technology, Inc., Boise, ID (US)

(*) Notice: Subject to any disclaimer, the term of this patent is extended or adjusted under 35 U.S.C. 154(b) by 591 days.

(21) Appl. No.: 12/261,124

(22) Filed: Oct. 30, 2008

(65) Prior Publication Data

US 2010/0115176 A1     May 6, 2010

(51) Int. Cl.
 *G06F 12/00* (2006.01)
(52) U.S. Cl. .............. 711/154; 711/105; 365/185.24
(58) Field of Classification Search .............. None
 See application file for complete search history.

(56) References Cited

U.S. PATENT DOCUMENTS

| | | | | |
|---|---|---|---|---|
| 2004/0153817 A1* | 8/2004 | Norman et al. | ............... | 714/37 |
| 2008/0010581 A1* | 1/2008 | Alrod et al. | ............... | 714/763 |
| 2008/0244338 A1* | 10/2008 | Mokhlesi et al. | ............ | 714/702 |
| 2009/0129153 A1* | 5/2009 | Sarin et al. | ............ | 365/185.03 |
| 2010/0058003 A1* | 3/2010 | Goto et al. | ............ | 711/154 |

* cited by examiner

*Primary Examiner* — Than Nguyen
(74) *Attorney, Agent, or Firm* — Leffert Jay & Polglaze, P.A.

(57) ABSTRACT

Methods for data transfer and/or programming a memory device, memory devices and memory systems are provided. According to at least one such method, additional data is appended to original data and the resulting data is programmed in a selected memory cell. The appended data increases the program threshold voltage margin of the original data. The appended data can be a duplicate of the original data or logical zeros. When the selected memory cell is read, the memory control circuitry can read just the original data in the MSB field or the memory control circuitry can read the entire programmed data and ignore the LSB field, for example.

31 Claims, 8 Drawing Sheets

| Threshold Voltage Reference (Volts) | Fixed DAC Bit Pattern (Fixed Reference) | Data to be Written in Memory | Translated data actually written after data translation table | Possible actual data read after | Read Data Interpretation after translation back from translation table |
|---|---|---|---|---|---|
| 3.75 | 1111 | | 1111 | 1111 | 11 |
| 3.50 | 1110 | | | 1110 | 11 |
| 3.25 | 1101 | | | 1101 | 11 |
| 3.00 | 1100 | 11 | | 1100 | 10 |
| 2.75 | 1011 | | 1011 | 1011 | 10 |
| 2.50 | 1010 | | | 1010 | 10 |
| 2.25 | 1001 | | | 1001 | 10 |
| 2.00 | 1000 | 10 | | 1000 | 01 |
| 1.75 | 0111 | | | 0111 | 01 |
| 1.50 | 0110 | | 1000 | 0110 | 01 |
| 1.25 | 0101 | | | 0101 | 01 |
| 1.00 | 0100 | 01 | | 0100 | 01 |
| 0.75 | 0011 | | | 0011 | 00 |
| 0.50 | 0010 | | | 0010 | 00 |
| 0.25 | 0001 | | | 0001 | 00 |
| 0.00 | 0000 | 00 | 0000 | 0000 | 00 |

| Threshold Voltage (volts) | Fixed DAC Bit Pattern (Reference) | Write Data Transfer (MSB) | Appended Data (LSB) | Data Written with Program Verify Levels (MSB+LSB) | Worst Case Data Read For Correct MSB (MSB+LSB) | Read Data Transfer (MSB) |
|---|---|---|---|---|---|---|
| 3.75 | 1111 | | | | | |
| 3.50 | 1110 | | | | | |
| 3.25 | 1101 | | | | | |
| 3.00 | 1100 | 11 | 11 | | | |
| 2.75 | 1011 | | | 1111 | | |
| 2.50 | 1010 | | | | 1100 | 11 |
| 2.25 | 1001 | | | | | |
| 2.00 | 1000 | 10 | 10 | 1010 | 1000 | 10 |
| 1.75 | 0111 | | | | | |
| 1.50 | 0110 | | | | | |
| 1.25 | 0101 | | | 0101 | 0100 | 01 |
| 1.00 | 0100 | 01 | 01 | | | |
| 0.75 | 0011 | | | | | |
| 0.50 | 0010 | | | | | |
| 0.25 | 0001 | | | | | |
| 0.00 | 0000 | 00 | 00 | 0000 | 0000 | 00 |

FIG. 3

| Threshold Voltage (volts) | Fixed DAC Bit Pattern (Reference) | Write Data Transfer (MSB) | Appended Data (LSB) | Data Written with Program Verify Levels (MSB+LSB) | Worst Case Data Read Variations Acceptable For Correct MSB | Read Data Transfer (MSB) |
|---|---|---|---|---|---|---|
| 3.75 | 1111 | | | | | |
| 3.50 | 1110 | | | | | |
| 3.25 | 1101 | | | | | |
| 3.00 | 1100 | | | | | |
| 2.75 | 1011 | 1 | 011 | 1011 | | |
| 2.50 | 1010 | | | | | |
| 2.25 | 1001 | | | | | |
| 2.00 | 1000 | | | | 1000 | 1 |
| 1.75 | 0111 | | | | 0111 | 0 |
| 1.50 | 0110 | | | | | |
| 1.25 | 0101 | | | | | |
| 1.00 | 0100 | | | | | |
| 0.75 | 0011 | 0 | 011 | 0011 | | |
| 0.50 | 0010 | | | | | |
| 0.25 | 0001 | | | | | |
| 0.00 | 0000 | | | | | |

FIG. 5

| Threshold Voltage (volts) | Fixed DAC Bit Pattern (Reference) | Write Data Transfer (MSB) | Appended Data (LSB) | Data Written with Program Verify Levels (MSB+LSB) | Worst Case Data Read Acceptable For Correct MSB | Read Data Transfer (MSB) |
|---|---|---|---|---|---|---|
| 3.75 | 1111 | | | | | |
| 3.50 | 1110 | | | 1110 | | |
| 3.25 | 1101 | | | | | |
| 3.00 | 1100 | | | | | |
| 2.75 | 1011 | | | | | |
| 2.50 | 1010 | | | | | |
| 2.25 | 1001 | | | | | |
| 2.00 | 1000 | 1 | 11 | | 1000 | 1 |
| 1.75 | 0111 | | | | 0111 | 0 |
| 1.50 | 0110 | | | | | |
| 1.25 | 0101 | | | | | |
| 1.00 | 0100 | | | | | |
| 0.75 | 0011 | | | | | |
| 0.50 | 0010 | | | | | |
| 0.25 | 0001 | | | | | |
| 0.00 | 0000 | 0 | 00 | 0000 | | |

FIG. 6

| Threshold Voltage (volts) | Fixed DAC Bit Pattern (Reference) | Write Data Transfer (MSB) | Appended Data (LSB) | Data Written with Program Verify Levels (MSB+LSB) | Data Read Variations Acceptable For Correct MSB | Read Data Transfer (MSB) |
|---|---|---|---|---|---|---|
| 3.75 | 1111 |  |  | 1111 | 1111 | 11 |
| 3.50 | 1110 |  |  |  | 1110 | 11 |
| 3.25 | 1101 |  |  |  | 1101 | 11 |
| 3.00 | 1100 | 11 |  |  | 1100 | 11 |
| 2.75 | 1011 |  |  |  | 1011 | 10 |
| 2.50 | 1010 |  | 11 | 1010 | 1010 | 10 |
| 2.25 | 1001 |  |  |  | 1001 | 10 |
| 2.00 | 1000 | 10 |  |  | 1000 | 10 |
| 1.75 | 0111 |  | 10 |  | 0111 | 01 |
| 1.50 | 0110 |  |  |  | 0110 | 01 |
| 1.25 | 0101 |  |  | 0101 | 0101 | 01 |
| 1.00 | 0100 | 01 | 01 |  | 0100 | 01 |
| 0.75 | 0011 |  |  |  | 0011 | 00 |
| 0.50 | 0010 |  |  |  | 0010 | 00 |
| 0.25 | 0001 |  | 00 |  | 0001 | 00 |
| 0.00 | 0000 | 00 |  | 0000 | 0000 | 00 |

FIG. 7

| Threshold Voltage Reference (Volts) | Fixed DAC Bit Pattern (Fixed Reference) | Data to be Written in Memory | Translated data actually written after data translation table | Possible actual data read after | Read Data Interpretation after translation back from translation table |
|---|---|---|---|---|---|
| 3.75 | 1111 | 11 | 1111 | 1111 | 11 |
| 3.50 | 1110 | | | 1110 | 11 |
| 3.25 | 1101 | | | 1101 | 11 |
| 3.00 | 1100 | | | 1100 | 10 |
| 2.75 | 1011 | 10 | 1011 | 1011 | 10 |
| 2.50 | 1010 | | | 1010 | 10 |
| 2.25 | 1001 | | | 1001 | 10 |
| 2.00 | 1000 | | | 1000 | 01 |
| 1.75 | 0111 | 01 | | 0111 | 01 |
| 1.50 | 0110 | | 1000 | 0110 | 01 |
| 1.25 | 0101 | | | 0101 | 01 |
| 1.00 | 0100 | | | 0100 | 01 |
| 0.75 | 0011 | 00 | | 0011 | 00 |
| 0.50 | 0010 | | 0000 | 0010 | 00 |
| 0.25 | 0001 | | | 0001 | 00 |
| 0.00 | 0000 | | | 0000 | 00 |

FIG. 8

PROGRAMMING MEMORY CELLS WITH ADDITIONAL DATA FOR INCREASED THRESHOLD VOLTAGE RESOLUTION

TECHNICAL FIELD OF THE INVENTION

The present invention relates generally to memory devices and in a particular embodiment the present invention relates to non-volatile memory devices.

BACKGROUND OF THE INVENTION

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance of computer processors increases, the performance of the memory in the computer should also increase, without impacting program or read reliability, to keep from becoming a bottleneck during data transfers. The density of flash memory arrays has also historically been increasing by increasing the quantity of bits storable in each memory cell. This results in greater quantities of data to be transferred to the memory array within a certain time period.

For the reasons stated above, and for other reasons stated below that will become apparent to those skilled in the art upon reading and understanding the present specification, there is a need in the art to increase the speed of data transfers without impacting program reliability in memory devices.

BRIEF DESCRIPTION OF THE DRAWINGS

FIG. 3 shows one embodiment of a table of threshold voltage levels and their associated fixed reference bit patterns and assigned data bit patterns.

FIG. 5 shows an alternate embodiment of a table of threshold voltage levels and their associated fixed reference bit patterns and assigned data bit patterns.

FIG. 6 shows another alternate embodiment of a table of threshold voltage levels and their associated fixed reference bit patterns and assigned data bit patterns.

FIG. 7 shows yet another alternate embodiment of a table of threshold voltage levels and their associated fixed reference bit patterns and assigned data bit patterns.

FIG. 8 shows yet another alternate embodiment of a table of the threshold voltage levels and their associated fixed reference bit patterns and assigned data bit patterns.

DETAILED DESCRIPTION

Figure 1:
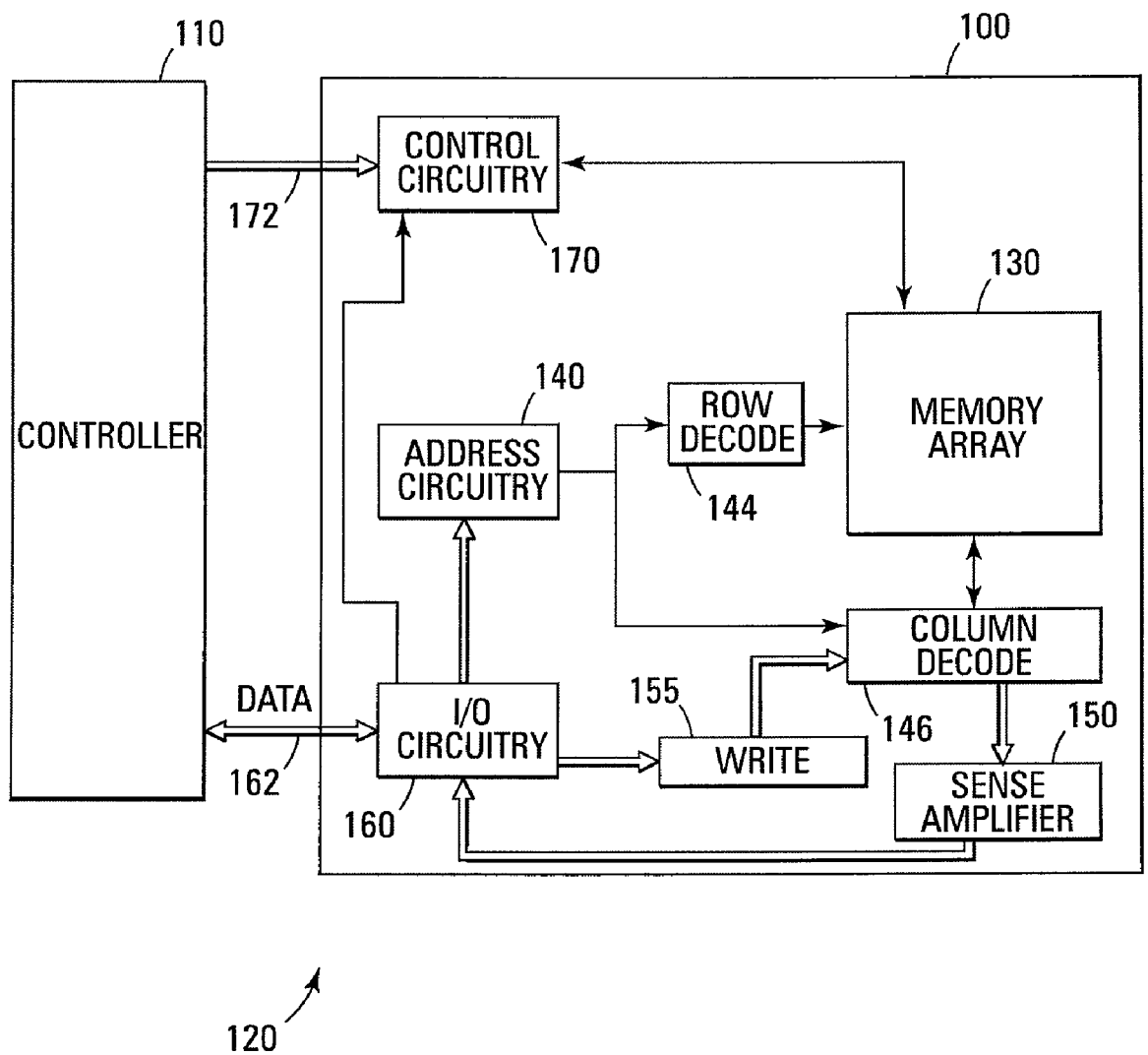
FIG. 1 shows a block diagram of one embodiment of a memory system that incorporates a data transfer method.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a functional block diagram of a memory system 120 that includes a memory device 100. The memory device 100 has been simplified to focus on features of the memory that are helpful in understanding the present embodiments for data transfer. The memory device 100 is coupled to an external system controller 110. The controller 110 may be a microprocessor or some other type of control circuitry.

The memory device 100 includes an array 130 of non-volatile memory cells, such as the one illustrated in FIG. 2 and discussed subsequently. The memory array 130 is arranged in banks of word line rows and bit line columns. In one embodiment, the columns of the memory array 130 are comprised of series strings of memory cells. As is well known in the art, the connections of the cells to the bit lines determines whether the array is a NAND architecture, an AND architecture, or a NOR architecture.

Address buffer circuitry 140 is provided to latch address signals provided through the I/O circuitry 160. Address signals are received and decoded by a row decoder 144 and a column decoder 146 to access the memory array 130. It will be appreciated by those skilled in the art, with the benefit of the present description, that the number of address input connections depends on the density and architecture of the memory array 130. That is, the number of addresses increases with both increased memory cell counts and increased bank and block counts.

The memory device 100 reads data in the memory array 130 by sensing voltage or current changes in the memory array columns using sense amplifier circuitry 150. The sense amplifier circuitry 150, in one embodiment, is coupled to read and latch a row of data from the memory array 130. I/O circuitry 160 is included for bidirectional data communication as well as address communication over a plurality of data connections 162 with the controller 110. Write circuitry 155 is provided to write data to the memory array.

Memory control circuitry 170 decodes signals provided on control connections 172 from the processor 110. These signals are used to control the operations on the memory array 130, including data read, data write (program), and erase operations. The memory control circuitry 170 may be a state machine, a sequencer, or some other type of controller to generate the memory control signals. In one embodiment, the memory control circuitry 170 is configured to transfer data to the memory array 130 for programming. The memory control circuitry 170 is further configured to read data from the memory array 130.

Figure 2:
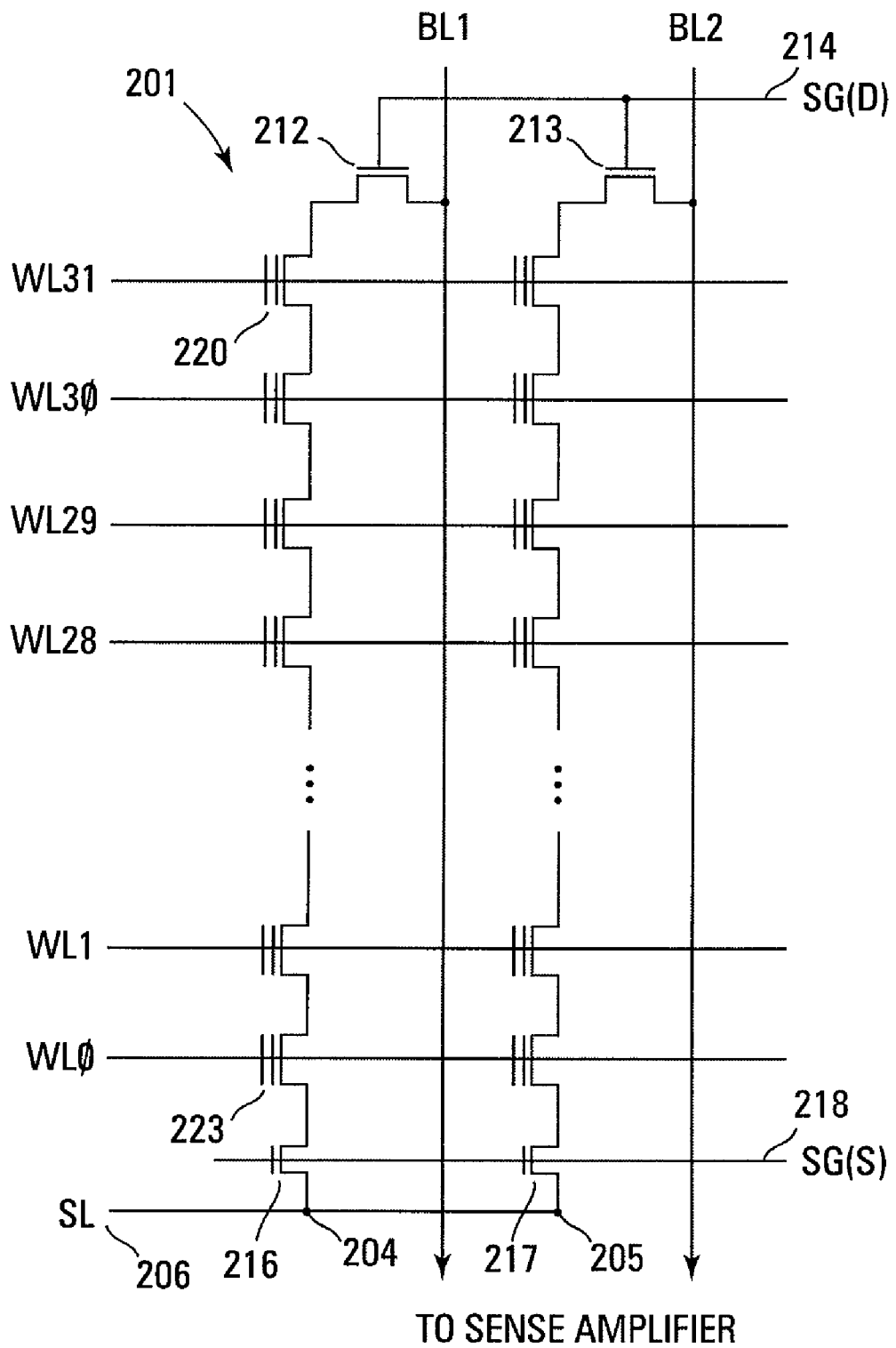
FIG. 2 shows a schematic diagram of one embodiment of a portion of a non-volatile memory array in accordance with the memory system of FIG. 1.

FIG. 2 illustrates a schematic diagram of a portion of a NAND architecture memory array 201 comprising series strings of non-volatile memory cells on which the embodiments of the subsequently discussed data transfer method operate. While the subsequent discussions refer to a NAND memory device, the present embodiments are not limited to such an architecture but can be used in other memory device architectures as well.

The array is comprised of an array of non-volatile memory cells 201 (e.g., floating gate) arranged in columns such as series strings 204, 205. Each of the cells 201 are coupled drain to source in each series string 204, 205. A word line WL0-WL31 that spans across multiple series strings 204, 205 is connected to the control gates of each memory cell in a row in order to bias the control gates of the memory cells in the row. The bit lines BL1, BL2 are eventually connected to sense amplifiers (not shown) that detect the state of each cell by sensing current on a particular bit line.

Each series string 204, 205 of memory cells is coupled to a source line 206 by a source select gate 216, 217 and to an individual bit line BL1, BL2 by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ ranges that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

One embodiment of the different states assignable to an MLC is illustrated in FIG. 3. The first column shows the threshold voltage levels that constitute the range of threshold voltages for one particular memory device. This table starts at 0V and goes up to a maximum programmed level of 3.75V in increments of 0.25V.

Alternate embodiments can use other threshold voltages based on a different range of threshold voltages. For example, another memory technology might have a maximum voltage that is different than 3.75V. Yet another memory device technology might be able to use threshold voltage levels that are closer together than 0.25V and still discriminate between the different levels.

The second column lists a reference state, each being assigned a distinct 4-bit fixed digital-to-analog converter (DAC) reference bit pattern, for each of the different threshold voltage levels for the memory device. The lowest threshold voltage is assigned a bit pattern of "0000" and the most positive threshold voltage in the threshold voltage range is a logical "1111". Each bit change represents the 0.25V threshold voltage increment.

In one embodiment, the reference fixed bit patterns are generated by the memory control circuitry and are used in an embodiment that operates in the digital domain. In other words, when a read operation is performed on the memory array, the array outputs a signal corresponding to one of the four-bit reference fixed bit patterns for each cell that is read, instead of a threshold voltage. In an alternate embodiment that operates in the analog domain, the actual threshold voltage of each memory cell being read is output instead of the fixed digital DAC bit pattern.

In the embodiment of FIG. 3, the programmed state represented by "1111" corresponds to the maximum programmed threshold voltage level for the memory cells of the memory block and represents the top of the programmable window.

The bit pattern "0000" corresponds to the erased level of the memory block and represents the bottom of the programmable window.

The third column of the table of FIG. 3 lists the MSB write data to be transferred. In the illustrated example, the MSB field is comprised of two bits. Alternate embodiments can use other quantities of bits.

In order to increase the data programming rate of a memory device, only two bits are transferred from the memory controller to the memory array for programming in each cell. Reducing the quantity of transferred bits reduces the number of clock cycles required to transfer the data and, thus, increases the data rate.

However, if only two bits were programmed into a cell that is configured to store four bits of data, the read algorithm would not know if the stored data were the most significant bits (MSBs) or the least significant bits (LSBs). Thus, the data transfer and programming embodiments append two additional bits to the initial two bits as a "place holder". These four bits are then programmed into the selected memory cell or cells.

In one embodiment, a logical "00" is appended to each two bits of data. For example, if a logical "01" were to be programmed, the memory controller would transfer the "01" to the memory array that would then program "0100" into the selected memory cell. The read algorithm would then read only the MSBs "01" at a later time knowing that the LSBs are not relevant. The fourth column of the table lists the LSB data field to be appended to the MSB field of the third column. The appended data, in the illustrated embodiment, is the mirror of the MSB data.

The fifth column of the table of FIG. 3 lists the MSB+LSB data that is written to the memory cell. The data is aligned in the table with the program verify threshold level to which the memory cell will be programmed if the respective data is programmed to the cell. For example, if the data "0101" is programmed to a memory cell, the memory cell will be programmed to a threshold voltage of 1.25V. If the data "1010" is programmed to the memory cell, the memory cell is programmed to a threshold voltage of 2.50V. Similarly, if the data "1111" is programmed, the memory cell is programmed to a threshold voltage of 3.75V.

The table also shows the difference in threshold voltages between the transferred write data of the second column and the MSB+LSB data that is actually programmed to the memory cell. For example, if it is desired to program "10" to a four bit memory cell, this data is assigned the threshold level of 2.00V. The four bits of data (MSB+LSB data) actually written to the memory cell is "1010" that has a threshold voltage level of 2.50V. This difference in threshold voltages provides a 0.50V "buffer" that the memory cell can lose in stored charge before the original data (i.e., "10") is lost due to the threshold voltage of the cell going below 2.00V.

It is well known in the art that the floating gate of a programmed memory cell can experience multiple forms of charge loss that occur at the time of ion implantation that can cause defects in the data retention characteristics of the floating gate. The charge loss scenarios include single bit charge loss, intrinsic charge loss, and quick charge loss.

Single bit charge loss is the result of a defective memory cell that exhibits electron leakage. This leakage can be accelerated with voltage or high temperature stress and results in inferior data retention.

Intrinsic charge loss is an immediate leakage of electrons from the floating gate, closest to the tunnel oxide, after a programming pulse. The trapped charge initially causes the cell $V_t$ to appear higher than the floating gate is programmed.

The leakage of these electrons after programming then causes a one time shift in the threshold voltage.

Quick charge loss also causes an immediate $V_t$ shift after a programming pulse. Quick charge loss is the result of electrons trapped in the tunnel oxide layer after the programming pulse moving back into the channel region. When a cell passes the verify operation, the programmed threshold voltage appears to be higher due to the trapped charge in the tunnel oxide. When the cell is read after the program operation has been completed, the cell has a $V_t$ that is lower than the $V_t$ obtained during the program verify operation due to the charge in the tunnel oxide leaking out to the channel region.

The sixth column of the table of FIG. 3 lists the worst case data read for correct MSB data (MSB+LSB) with its associated threshold voltage level. For example, if "1000" is read from the selected memory cell, that data is associated with a threshold voltage level of 2.00V. This column shows that the threshold voltage has been reduced due to charge loss but the correct MSB data is still intact. The LSB field has been reduced to "00" from the programmed "10" but this field is not relevant since only the MSB field is read.

The seventh column then shows the actual data that is transferred back to the reading circuit. This data is the MSB of the read data from the selected cell. In the instance of reading the "1000", the "10" MSB field is the data that is actually transferred since the LSB field is ignored.

Figure 4:
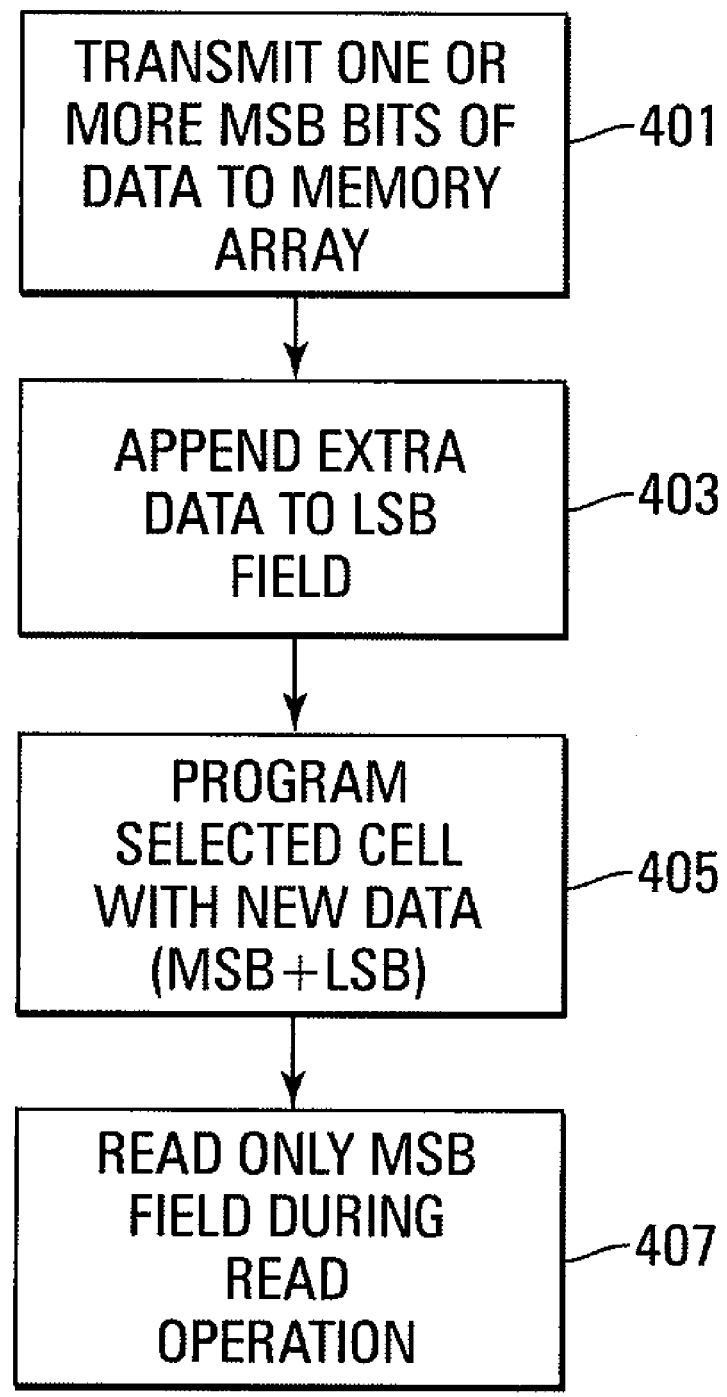
FIG. 4 shows flowchart of one embodiment of a method for enhancing data transfer and program reliability in a memory device.

FIG. 4 illustrates a flowchart of one embodiment of a method for enhancing data transfers in a memory device. The embodiment of FIG. 4 increases the speed of the transfer of data from the memory control circuitry 170 to the memory array 130, as illustrated in FIG. 1, without impacting the reliability of the programming or reading of the data.

The method starts when the memory controller transmits one or more MSB data bits to the memory array for programming 401. The memory array receives the data and appends the additional bits to the LSB field 403. As described previously, one embodiment can append two bits that are duplicates of the original data to be programmed. Another embodiment can append two logical zero bits.

In another embodiment, more than two bits can be added to the original data to be programmed. For example, if either "00" or a mirror of the original MSB data were appended to the original two MSB data bits, an additional "fifth bit" of a logical "0" or a logical "1" could be added at the end of the data string. This would provide an even greater threshold voltage margin in case of a large charge loss environment.

The memory array then programs the newly formed data word, with the appended bits (MSB+LSB), to the selected memory cell 405. This is accomplished with a programming pulse followed by a verify pulse. The programming pulse can start around 14V-16V and incrementally increase after each failed verify operation.

The verify pulse is typically a ramp voltage pulse that increases until the selected memory cell turns on and causes a current to flow on the bit line coupled to the selected cell. The voltage at which the cell turns on is the threshold voltage to which the floating gate is programmed. If this is less than the target voltage, the verify operation has failed and another programming pulse is issued. The program/verify operations are repeated until either the memory cell passes the verify or a certain number of programming pulses have been issued and the selected cell is still not programmed. In this case, an error condition is flagged.

When the programmed memory cell is read, only the MSB that was programmed with the original data is read 407. In an alternate embodiment, the LSB bits are read but discarded during subsequent processing.

FIGS. 5-7 illustrate alternate embodiments of the table of FIG. 3. These different embodiments show other possible write data with the resulting appended data, data written, and read data transferred.

As in the embodiment of FIG. 3, the first column shows the threshold voltage levels that constitute the range of threshold voltages for one particular memory device. The second column lists a reference state, each being assigned a distinct 4-bit fixed digital-to-analog converter (DAC) reference bit pattern, for each of the different threshold voltage levels for the memory device.

The third column of FIGS. 5 and 6 shows that these are SLC devices since the MSB is a single logical bit. The remaining columns show the appended data, data written with program verify levels, worst case data read variations, and the read data transferred as explained with reference to FIG. 3.

The embodiment of FIG. 7 is an MLC device like the FIG. 3 embodiment and uses the same write data, appended data and, thus, the same data written (MSB+LSB) as the FIG. 3 embodiment. However, column 6 of FIG. 7 lists the possible data read variations that are acceptable for a correct MSB. Column 7 lists the read data that is transferred (MSB).

FIG. 8 illustrates another alternate embodiment of a table of threshold voltage levels and their associated fixed reference bit patterns and assigned data bit patterns. As in the embodiment of FIG. 7 the first three columns of FIG. 8 show the Threshold Voltage Reference, the Fixed DAC Bit Pattern (Fixed Reference word), and the Data to be Written to Memory.

However, in this embodiment a 5 LSB window is used to interpret the "01" data. The larger the LSB window of interpretation, the more margin of error for those particular data bits. The interpretation windows can be made larger or smaller using translation tables for actual data stored.

The embodiment of FIG. 8 provides a larger margin of error for the "01" data to compensate for more disturb in the requisite threshold voltage range of 1V to 2V. The "10" data is interpreted using a 4 LSB window.

The fifth column shows the possible actual data that can be read after programming. This column shows the data that might be read if, due to disturb conditions, the programmed data word is altered. The sixth column shows the interpreted data read back after translation.

The embodiment illustrated in FIG. 8 shows the translation table for the write data and for the read data being different. In an alternate embodiment, the translation tables can be the same. In other words, the fourth column (i.e., the write translation table) and the sixth column (i.e., the read translation table) can be either the same data or different.

In another embodiment, the entire data string can be translated, both the MSB and the LSB, to another digital pattern to be programmed. The translation table can thus be used to open or close the data threshold voltage level window depending on the disturb protection desired between levels. When the stored data pattern is read, the translation table is accessed to translate the read pattern back to the original data.

CONCLUSION

In summary, one or more embodiments append additional digits to target data to be programmed in order to form a new programming word. The additional bits provide greater margins between the threshold voltage represented by the original data and the next lower threshold voltage that would be represented by a loss of data.

The memory can receive n bits and append m bits to generate the new word having n+m bits or the control circuit can append the additional bits to the original data. The bit lengths n and m do not have to be equal. The attached bits can be different depending on the original data pattern. By appending different appended bits to the original bits, either the memory or the control circuit can open or close the window between data threshold voltage levels. By appending different bits, the threshold distributions can be spread out or made narrower.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for data transfer and programming in a memory device, the method comprising:
    transferring original data to a memory array;
    appending additional digits to the original data to form a new programming word wherein the additional digits comprise mirror bits of the original data; and
    programming the new programming word to the memory array.

2. The method of claim 1 wherein transferring the original data comprises a memory control circuitry transferring the original data to the memory array.

3. The method of claim 1 wherein the additional digits comprise a plurality of logical zero bits.

4. The method of claim 1 wherein the original data comprises a plurality of logical bits.

5. The method of claim 1 wherein the original data comprises a logical bit.

6. The method of claim 1 wherein transferring the original data comprises transferring one logical bit and programming the new programming word comprises programming three or more logical bits.

7. The method of claim 1 wherein transferring the original data comprises transferring two logical bits and programming the new programming word comprises programming a plurality of logical bits.

8. The method of claim 1 wherein the additional digits comprise three logical bits.

9. A method for programming a non-volatile memory device, the method comprising:
    a memory array receiving, from a control circuit, original data for programming to a selected memory cell;
    forming a new data word for programming that comprises the original data as most significant bits and additional data as least significant bits;
    programming the new data word to the selected memory cell;
    verifying successful programming of the new data word; and
    reading the selected memory cell wherein all bits of the new data word are read and the least significant bits are ignored.

10. The method of claim 9 and further including reading the selected memory cell wherein only the most significant bits are read.

11. The method of claim 9 wherein forming the new data word comprises the memory array forming the new data word.

12. The method of claim 9 and further including the control circuit transmitting a plurality of logical bits of original data.

13. The method of claim 9 wherein programming the new data comprises increasing a threshold voltage from an initial erased voltage to a target voltage indicative of the new data word.

14. The method of claim 9 wherein the memory array receiving comprises receiving the original data and the additional data, appended to the original data, from the control circuit.

15. The method of claim 9 wherein the memory array receives n original data bits and appends m bits of the additional data, wherein n is not equal to m.

16. The method of claim 15 wherein the control circuit transmits n+m bits to the memory array.

17. The method of claim 16 wherein n is not equal to m.

18. The method of claim 9 wherein the new data word can open or close a window between data threshold voltage levels in response to the additional data.

19. A non-volatile memory device comprising:
    memory control circuitry for controlling operation of the memory device, the memory control circuitry configured to transmit original data; and
    a memory array, coupled to the memory control circuitry, that operates in response to the memory control circuitry, the memory array configured to be programmed with the original data and append additional data wherein the appended additional data increases a programmed threshold voltage margin of the original data, wherein the memory control circuitry is further configured to read the programmed original data and appended additional data and ignore the appended additional data.

20. The memory device of claim 19 wherein the memory array comprises a NAND architecture.

21. The memory device of claim 19 wherein the memory control circuitry is configured to read only the original data that was programmed with the appended additional data.

22. A memory system comprising:
    a system controller for controlling operation of the memory system with memory signals; and
    a memory device, coupled to the control circuit and operating in response to the memory signals, the memory device comprising:
        memory control circuitry coupled to the system controller and receiving original data from the system controller; and
        an array of memory cells coupled to the memory control circuitry and configured to receive the original data from the memory control circuitry and append additional data to the original data such that the additional data are duplicate of the original data and increases a program threshold voltage margin of the original data.

23. The memory system of claim 22 wherein the array of memory cells is configured to append additional data that are logical zeros.

24. A method for programming a memory device, the method comprising:
    forming a new data word from original data for programming a selected memory cell, the new data word comprises a translation of the original data with data that are mirror bits of the original data; and
    programming the new data word to the selected memory cell.

25. The method of claim 24 wherein forming the new data word comprises accessing a translation table.

26. The method of claim 24 wherein forming the new data is performed by the memory device.

27. The method of claim 24 wherein a window between threshold voltage levels is either increased or decreased in response to the translation of the original data.

28. The method of claim 27 wherein the window between threshold voltage levels is different between adjacent new data words.

29. The method of claim 25 and further including:
reading data from the selected memory cell;
accessing the translation table to interpret the read data; and
translating the read data back to the original data in response to the translation table.

30. A memory system comprising:
a system controller for controlling operation of the memory system with memory signals; and
a memory device, coupled to the control circuit and operating in response to the memory signals, the memory device comprising:
memory control circuitry coupled to the system controller and receiving original data from the system controller; and
an array of memory cells coupled to the memory control circuitry and configured to receive the original data from the memory control circuitry, append additional data to the original data to form a data combination, and translate the data combination to new data such that the new data are mirror bits of the original data and increases a program threshold voltage margin of the original data.

31. A memory system comprising:
a system controller for controlling operation of the memory system with memory signals wherein the system controller appends additional data to original data to form a data combination, translates the data combination to translated data such that the translated data are mirror bits of the original data and are configured to increase a program threshold voltage margin of the original data in a selected memory cell; and
a memory device, coupled to the system controller and configured to receive the translated data, the memory device comprising:
memory control circuitry coupled to the system controller and receiving the translated data; and
an array of memory cells coupled to the memory control circuitry and configured to store the translated data in a memory cell in response to the memory control circuitry.

* * * * *